United States Patent [19]

Zinser, Jr. et al.

[11] Patent Number: 4,649,505

[45] Date of Patent: Mar. 10, 1987

[54] TWO-INPUT CROSSTALK-RESISTANT ADAPTIVE NOISE CANCELLER

[75] Inventors: Richard L. Zinser, Jr.; Seth D. Silverstein; Steven R. Koch, all of Schenectady, N.Y.

[73] Assignee: General Electric Company, Schenectady, N.Y.

[21] Appl. No.: 627,251

[22] Filed: Jul. 2, 1984

[51] Int. Cl.[4] .................... H03F 1/266; H03K 5/159; G06F 7/38; H04B 3/20

[52] U.S. Cl. .................... 379/411; 364/724; 364/574; 358/36; 358/340; 375/103; 375/14; 381/71; 381/94

[58] Field of Search ............... 364/574, 724; 179/170.2; 370/32; 381/71, 94; 375/103, 14; 328/167; 358/36, 340

[56] References Cited

U.S. PATENT DOCUMENTS

| | | | |
|---|---|---|---|
| 4,044,241 | 8/1977 | Hatley, Jr. | 375/103 X |
| 4,112,370 | 9/1978 | Monsen | 375/14 X |
| 4,157,457 | 6/1979 | Sakoe et al. | 364/724 X |
| 4,247,940 | 1/1981 | Mueller et al. | 375/14 |
| 4,322,746 | 3/1982 | Oguino | 358/340 |
| 4,328,585 | 5/1982 | Monsen | 375/14 |
| 4,343,759 | 8/1982 | Kustka et al. | 364/724 X |
| 4,422,175 | 12/1983 | Bingham et al. | 364/724 X |
| 4,468,786 | 8/1984 | Davis | 364/724 X |
| 4,499,547 | 2/1985 | Inuiya et al. | 364/571 |

OTHER PUBLICATIONS

"Adaptive Noise Cancelling: Principles and Applications" B. Widrow et al., Proc. IEEE, vol. 63, pp. 1692–1716, (Dec. 1975).

Primary Examiner—Errol A. Krass
Assistant Examiner—Joseph L. Dixon
Attorney, Agent, or Firm—Geoffrey H. Krauss; James C. Davis, Jr.; Marvin Snyder

[57] ABSTRACT

A two-input crosstalk-resistant adaptive noise canceller receives a primary input signal including a desired speech signal portion and an undesired noise signal portion and also receives a reference input signal having a reference noise input portion and a crosstalk speech portion. The canceller has first and second summer means and first and second adaptive filter means. The first summer means provides a canceller output signal which is the difference between the primary input signal and the first adaptive filter output signal. The canceller output signal is applied to the reference input of the second adaptive filter and to one of a pair of error-control inputs of the first adaptive filter. The second error-control input of the first adaptive filter is provided by the signal at the output of the second adaptive filter, which receives a single error-control input signal from the output of the second summer means. The second summer provides an output signal which is the difference between the reference input signal and the second adapter filter output signal. With the correlation bias between the desired primary input (speech) signal and the crosstalk (speech) signal in the reference input substantially reduced, the canceller output signal is then related substantially only to the primary input desired signal.

25 Claims, 14 Drawing Figures

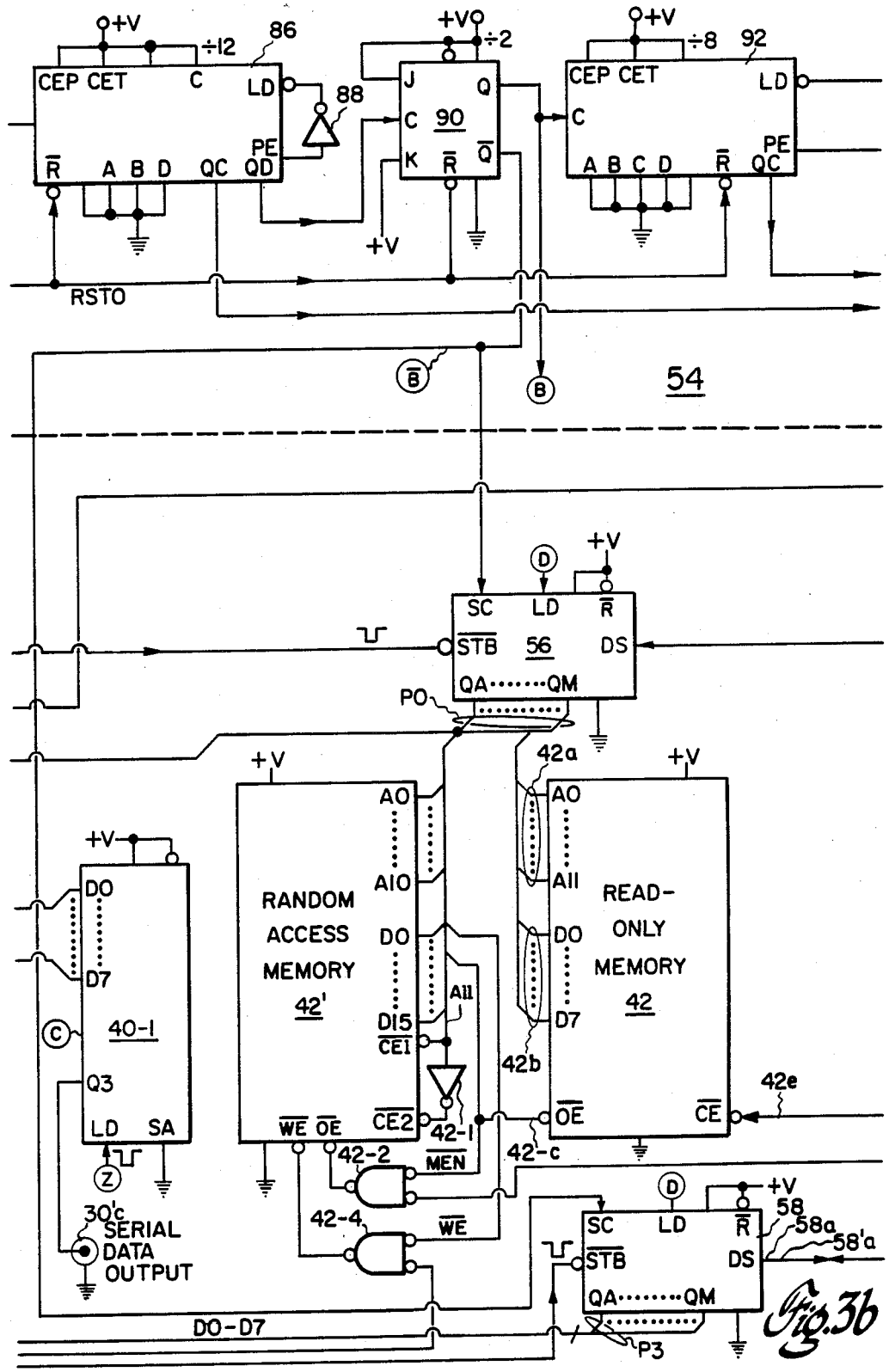

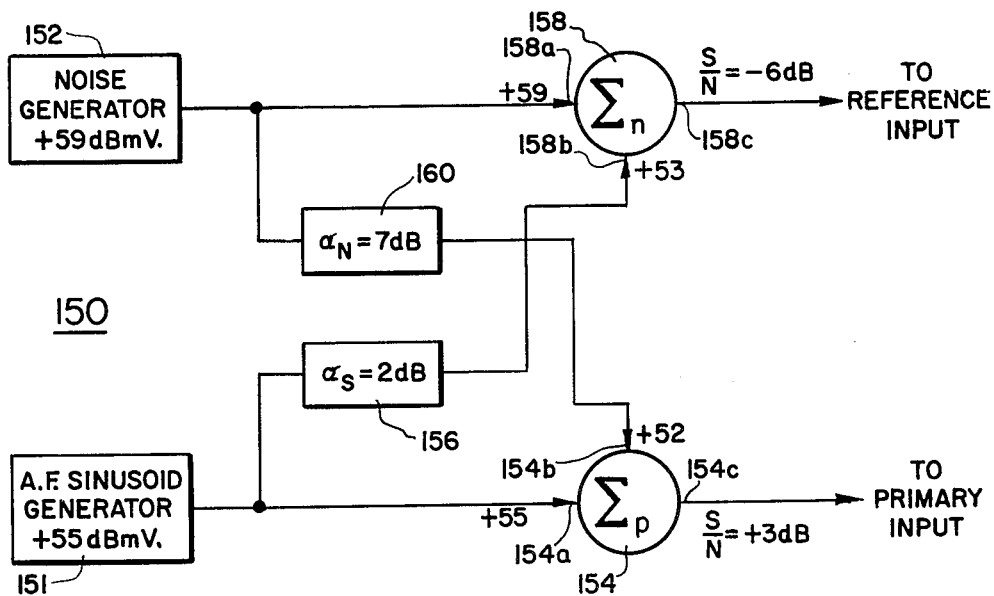
*Fig. 6*
*Fig. 6a*
*Fig. 6b*
*Fig. 6c*
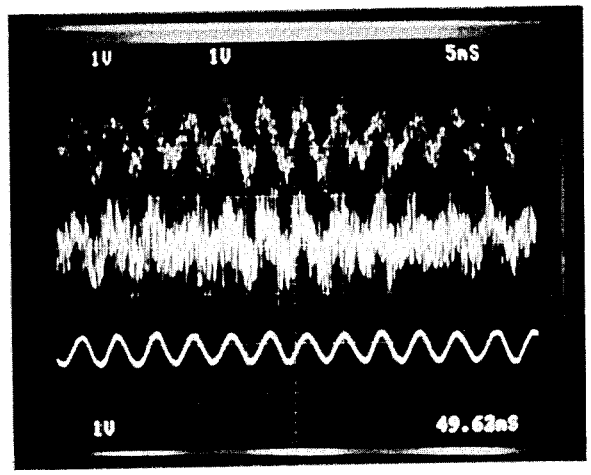

TWO-INPUT CROSSTALK-RESISTANT ADAPTIVE NOISE CANCELLER

BACKGROUND OF THE INVENTION

The present application relates to adaptive noise cancellers and, more particularly, to a novel two-input adaptive noise canceller which is resistant to crosstalk between the primary signal and reference noise inputs.

Dual-input adaptive cancellers are known to the communication arts. Many examples of such apparatus are reviewed by B. Widrow et al. in "Adaptive Noise Cancelling: Principles and Applications", Proc. IEEE, Vol. 63, Pages 1692–1716 (December 1975). This review article particularly illustrates the use of least-mean-square (LMS) gradient control algorithms, generally accepted to originate with Widrow.

PRIOR ART

Widrow's adaptive canceller 10 is illustrated in FIG. 1. The primary input 10a receives a signal which has both a desired signal component S(n), which may be a speech signal and the like, and a noise component w(n). The reference input 10b receives a reference signal r(n) which is assumed to be correlated to the noise signal w(n). Primary input 10a is connected to the additive+input 11a of a summer means 11, while a subtractive—input 11b thereof receives an input noise-component-related signal $\hat{w}(n)$; the difference between the primary input signal and the signal $\hat{w}(n)$ appears at output 11c of the summer means and provide the canceller output signal $\hat{S}(n)$ at output 10c. An adapter filter means 12 receives the reference input signal r(n) at a main, or reference, input 12a and receives the canceller output signal $\hat{S}(n)$ at a control, or error, input 12c for providing the $\hat{w}(n)$ signal at the adapter filter means output 12b.

One possible implementation of adapter filter means 12 is shown in FIG. 1a. The reference input 12a is connected to the input 14-0 of a tapped delay line 14, having a plurality N of taps 14-1 through 14-N. The signal at the delay line input and at each of the delay taps k', where k' = 1, 2, 3, ..., N provides a different one of the N+1 individual, increasingly-delayed, signals r(n), r(n−1), ..., r(n-N) for connection to the associated one of inputs 16-0a, 16-1a, 16-Na of N+1 gain-controlled amplifiers 16-0 through 16-N. The signals at the N+1 outputs 16-0b, 16-1b, ..., 16-Nb of the amplifiers is the product of the input signal r(n-k), where k=0, 1, 2, ..., N, and the individual amplifier gain $b_0, b_1, ..., b_N$, where the individual amplifier gain $b_k$ is set for each amplifier responsive to the signal received at a gain-control input 16-0c, 16-1c, ..., 16-Nc. The gain control signal at each input 16c is established at the output 18a of a least-mean-square (LMS) control means 18, having a first input 18b receiving the canceller output signal $\hat{S}(n)$ from error input terminal 12c, and a second input 18c receiving the reference input r(n) signal from input 12a. Control means 18 implements the stage gain $b_k$ in each time interval m=(n+1) in accordance with the formula: $b_k(n+1) = b_k(n) + 2\mu \hat{S}(n) \cdot r(n-k)$, where $\mu$ is a small, positive step-size constant. The output 16-kb of each amplifier is connected to an associated one of the N+1 inputs 20-0, 20-1, ..., 20-N of a N+1 input summer means 20, having an output 20a providing the adaptive filter means output signal w(n) to the adapter filter means output terminal 12b.

For this particular two-input adaptive canceller apparatus, Widrow has shown theoretical results for a converged, unconstrained Weiner filter in the presence of crosstalk, but this algorithm fails to converge under these conditions. Thus, Widrow's LMS gradient canceller, as with other classical two-source adaptive cancellers, requires that the reference input signal r(n) be a noise signal which is highly correlated with the noise signal portion w(n) of the primary input signal (which primary input signal is a combination of a desired, typically speech, signal portion and a noise signal portion) but which reference noise signal is substantially uncorrelated with the desired (speech) signal at the primary input. If the desired (speech) signal is present not only at the primary input but is also introduced into the reference input, the crosstalk condition obtains and the LMS gradient algorithm used to set the adaptive filter taps will no longer converge to the optimum solution; the system output signal-to-noise ratio will be degraded. In a practical situation, such as in mobile communications where the primary and reference input microphones are both located in the passenger compartment of the same automobile, it is extremely difficult to obtain a speech-free reference noise signal.

It is therefore highly desirable to provide a two-input adaptive noise canceller which will not experience serious degradation in its output when the desired (speech) signal is present in both the primary and reference noise input channels.

BRIEF SUMMARY OF THE INVENTION

In accordance with the present invention, a two-input crosstalk-resistant adaptive noise canceller, having a primary input signal including a desired speech signal portion and an undesired noise signal portion, and also having a reference input signal having a reference noise input portion and a crosstalk speech portion, comprises first and second summer means and first and second adaptive filter means. The first summer means provides a canceller output signal which is the difference between the primary input signal and the first adaptive filter means output signal. The canceller output signal is applied to the reference input of the second adaptive filter means and to one of a pair of error-control inputs of the first adaptive filter means. The second error-control input of the first adaptive filter means is provided by the signal at the output of the second adaptive filter means, which receives a single error-control input signal from the output of the second summer means. The second summer means provides an output signal which is the difference between the reference input signal and the second adapter filter means output signal. Thus, a second adaptive filter is utilized to estimate the crosstalk (i.e. the amount of desired signal at the reference input) portion present in the reference noise signal, such that the crosstalk portion is then subtracted from the reference input signal to eliminate errors in the two-input first adaptive filter means due to estimation bias. With the correlation bias between the desired primary input (speech) signal and the crosstalk (speech) signal in the reference input substantially reduced, the canceller output signal is then related substantially only to the primary input desired signal.

In a presently preferred embodiment of our novel two-input crosstalk-resistant automatic noise canceller, a digital-signal-processing microcontroller is utilized, along with associated read-only memory means and random-access memory means, to digitally process the primary input and reference input signals in accordance with a set of first and second adaptive filter means coefficients $b_k$ and $c_k$, respectively. The analog primary and reference input signals are each first converted from analog to digital serial signals, and are then converted from digital serial signals to digital parallel signals, for rapid processing in the digital-signal-processing means. The processed signal is provided as a serial data output signal $S(n)$ in which the correlation bias between the crosstalk speech signal in the reference input and the primary speech input signal is substantially reduced.

Accordingly, it is an object of the present invention to provide a novel two-input automatic noise canceller which is substantially crosstalk resistant.

This and other objects of the present invention will become apparent upon consideration of the following detailed description of our invention, when read in conjunction with the drawings.

BRIEF SUMMARY OF THE DRAWINGS

FIG. 6 is a block diagram of a test set-up for providing the signal photographs of FIGS. 6a-6c; and FIGS. 6a-6c are portions of a photograph of the primary input, reference input and output signals simultaneously observed for a two-input crosstalk-resistive adaptive noise canceller preferred embodiment, illustrating the crosstalk-resistance thereof.

DETAILED DESCRIPTION OF THE INVENTION

Figure 2:
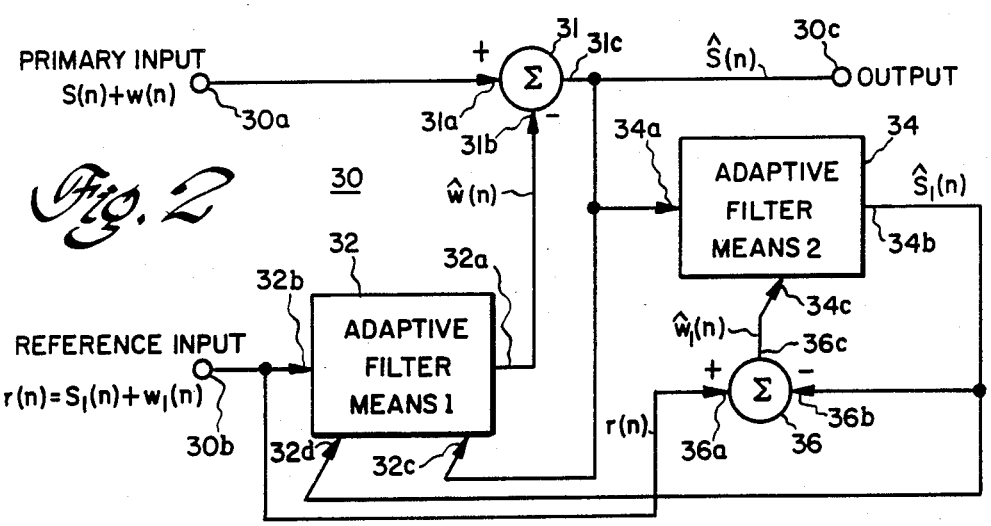
FIG. 2 is a block diagram of our novel two-input crosstalk-resistant adaptive noise canceller in accordance with the principles of the present invention.

Referring now to FIG. 2, our novel two-input crosstalk-resistant automatic noise canceller 30 has a primary input terminal 30a receiving a primary input signal which contains a desired speech signal $S(n)$ portion and an undesired primary input noise signal $w(n)$ portion. A reference input terminal 30b receives a reference input signal $r(n)$ which comprises a reference noise input signal $w_1(n)$ portion and a speech crosstalk signal $S_1(n)$ portion. Automatic noise canceller 30 provides an output signal terminal 30c with an output signal $\hat{S}(n)$ which is closely related to the desired primary speech input signal $S(n)$ and from which the noise input signal $w(n)$ portion has been substantially removed, without correlation bias due to the speech crosstalk signal $S_1(n)$ portion which is unavoidably present at reference input terminal 30b.

Adaptive noise canceller 30 utilizes a first summer ($\Sigma$) means 31 having a first, additive + input 31a receiving the primary input signal from primary input terminal 30a. First summer means 31 has a second, subtractive — input 31b receiving an adaptively-filtered reference noise signal $\hat{w}(n)$ from the output 32a of a first adaptive filter means 32, having a reference input 32b connected to reference input terminal 30b. The output 31c of first summer means 31 provides an output signal $\hat{S}(n)$ to the canceller output terminal 30c. The first summer means output 31c is also connected to a first error-control input 32c of the two-control-input first adaptive filter means 32, and to the reference input 34a of a single-control-input second adaptive filter means 34. The output 34b of second adaptive filter means 34 provides a signal $\hat{S}_1(n)$, which is an estimate of the speech signal (i.e. the crosstalk) present in the reference input at terminal 30b, for providing a second error-control signal to a second error-control input 32d of first adaptive filter means 32. The second adaptive filter means single error-control input 34c receives a control signal $\hat{w}_1(n)$. This $\hat{w}_1(n)$ signal is provided at the output of a second summer ($\Sigma$) means 36, having a first, additive + nput receiving the reference input terminal 30b reference signal $r(n)$ and having a second, subtractive − input 36b receiving the output signal $\hat{S}_1(n)$ from output 34b of the second adaptive filter means. Thus, the second summer means output 36c estimates the noise portion of the reference input.

Figure 1:
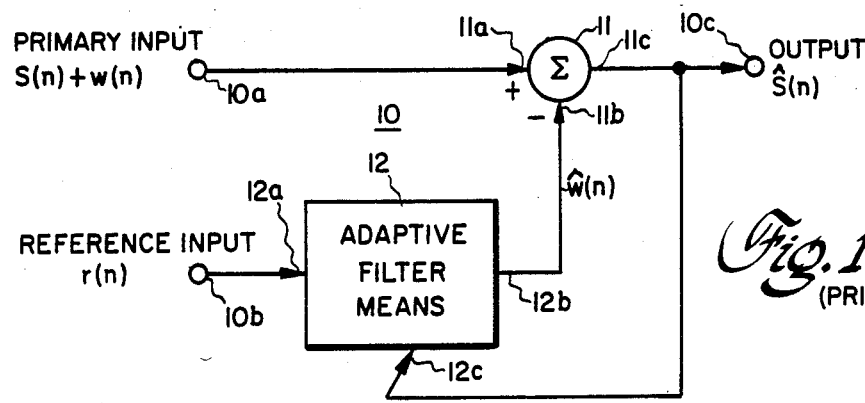
FIG. 1 is a block diagram of a prior-art two-input adaptive canceller.
Figure 1A:
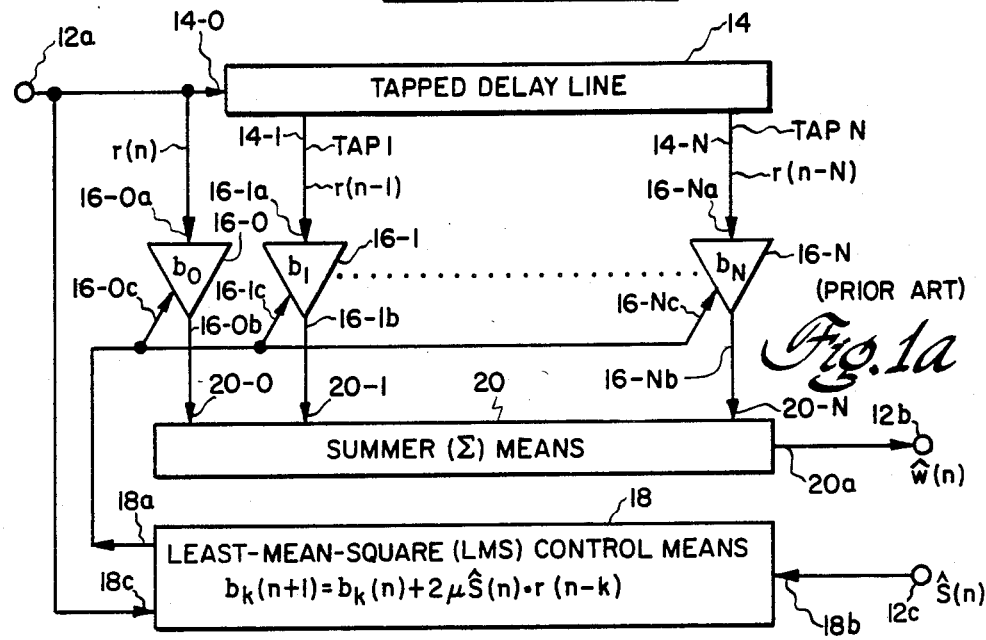
FIG. 1a is a block diagram of a finite impulse response filter usable for providing the adapter filter means of the prior art canceller of FIG. 1, and controlled in accordance with the Widrow LMS gradient algorithm.

Second adaptive filter means 34 may be a finite-impulse-response (FIR) filter utilizing a tapped delay line and of the form shown in FIG. 1a, where the second adaptive filter coefficients $c_k(n+1)$ are updated in accordance with the formula:

$$c_k(n+1) = c_k(n) + 2\mu[r(n) - \hat{S}_1(n)]\cdot\hat{S}(n-k) \tag{1}$$

for $k = 0, 1, \ldots, N$ (the number of filter delay line taps), and $\mu$ is a small positive step-size constant. First adaptive filter means 32 can also be an FIR filter, having a two-error-signal-input control means 18 (see FIG. 1a) for establishing the first adaptive filter coefficients $b_k(n+1)$ responsive to both the feedback signal $\hat{S}(n)$ at first control input 32c and the feedback signal $\hat{S}_1(n)$ at second control input 32d, so that $$b_k(n+1) = b_k(n) + 2\mu S(n)[r(n-k) - S1(n-k)]. \tag{2}$$

The foregoing equations (1) and (2) assume that the step-size constants $\mu$ of both adaptive filter means 32 and 34 are essentially the same and that both adaptive filter means 32 and 34 are implemented with a tapped delay line having the same number $k=N$ of taps. It will be understood by those skilled in the art that the single-control-input second adaptive filter means 34 can equally as well have a different step-size constant $\mu'$ and/or a different number of delay line taps $N'$ from the step-size constant $\mu$ and the number $N$ of delayed input signals provided for the double-control-input first adaptive filter means 32.

Figure 2A:
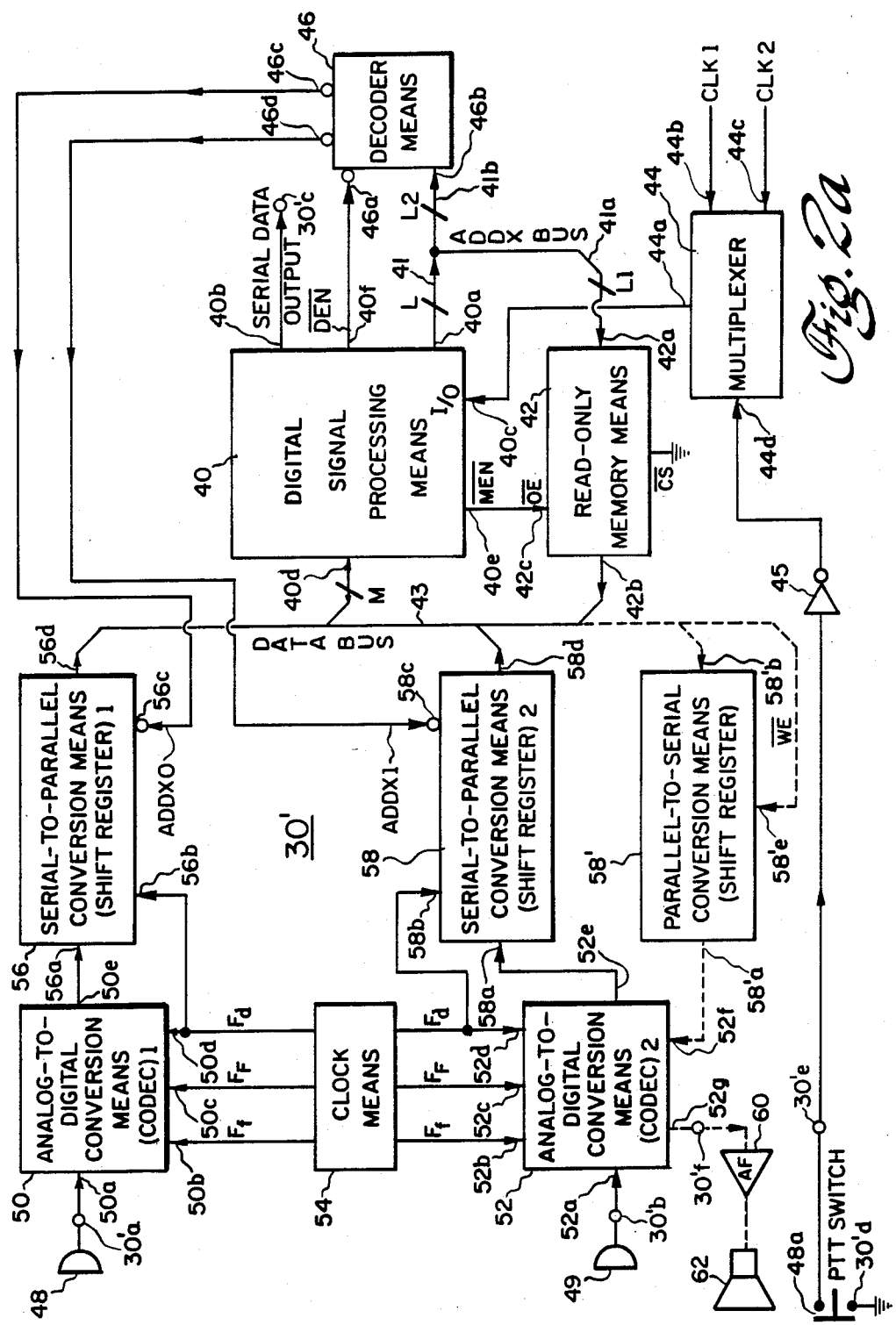
FIG. 2a is a block diagram of a presently preferred digital-signal-processing embodiment of the novel automatic noise canceller of FIG. 2.

While the crosstalk-resistant two-input automatic noise canceller 30 of FIG. 2 can be assembled with analog circuitry, utilizing analog forms of adaptive filter means (such as the FIR filter means of FIG. 1a and the like), the resulting canceller would be relatively bulky, due to the volume required for implementation of 2(N+1) analog amplifiers, a pair of tapped delay lines, a pair of (N+1) input analog summer means 20 (in addition to the dual input analog summer means 31 and 36), and the single-control-input and dual-control-input LMS control means for the first and second adaptive filters, respectively. We therefore prefer to convert the pair of input analog signals to a pair of digital signals and to provide not only the two adaptive filtering functions but also the two summing functions in a digital-signal-processing microcontroller, in the digital automatic noise canceller 30' of FIG. 2a.

The digital automatic noise canceller 30' utilizes a digital-signal-processing means 40 which has a first port 40a for driving an address (ADDX) bus 41. Address bus 41 has a plurality L of parallel lines, of which at least a somewhat smaller plurality L1 of lines form an extension 41a of the ADDX bus into a read-only memory means 42. The digital-signal-processing (DSP) means 40 illustratively has a serial data output 40b, connected to the digital automatic noise canceller apparatus output terminal 30'c. An input/output (I/O) terminal 40c receives a signal from the output 44a of a multiplexer means 44 determining which one of respective first frequency (CLK1) clock and second frequency (CLK2) clock signals, respectively provided to multiplexer inputs 44b and 44c, is provided to output 44a, responsive to the state of a signal at a control input 44d. DSP microcontroller means 40 has a data but port 40d, having a plurality M of parallel signal lines for carrying data into and out of the digital-signal-processing means, as from program memory means 42 and the like. The memory means output is enabled by an output enable $\overline{OE}$ signal provided at the memory enable ($\overline{MEN}$) output 40e of the DSP. A decoder enable ($\overline{DEN}$) output 40f is provided to a control input 46a of a decoder means 46, also receiving a plurality of L2 of the ADDX bus lines in another address bus extension 41b to a decoder data input port 46b. Dependent upon the state of the $\overline{DEN}$ signal and the signals on the L2 lines of ADDX bus extension 41b, either one, but not both, of decoder means first output 46c or second input 46d may be enabled at a particular time. Output 46c is utilized to enable the primary input digital data, in M-bit-parallel digital format, to travel along data bus 43 to DSP data port 40d, while decoder means output 46d enables the M-bit-parallel digital representation of the reference channel signal along data bus 43 to DSP port 40d.

The primary and reference signals originate with a pair of transducer means 48 and 49, such as microphones and the like, respectively providing analog signals to the primary input terminals 30'a and to the reference input terminals 30'b of the adaptive noise canceller (ANC) 30'. Primary signal input 30'a is connected to the analog input terminal 50a of a first analog-to-digital conversion, or CODEC, means 50. Simultaneously, a second analog-to-digital conversion, or CODEC, means 52 has the analog input 52a thereof provided with the reference analog signal from terminal 30'b. A clock means 54 provides master clock frequency $F_f$ signals to both first clock inputs 50b and 52b, framing clock frequency $F_F$ signals to both second clock inputs 50c and 52c, and encoding clock frequency $F_d$ signals to both third clock inputs 50d and 52d of CODEC means 1 and 2. Each of CODEC means 1 and 2 filters, compands and digitally encodes samples of the input analog signal, in accordance with a companded $\mu$-law format. The $\mu$-law serial-digital-encoded primary signal or reference signal is respectively provided at the CODEC 1 means output 50e or the CODEC 2 means output 52e, respectively. The serially-encoded digital primary signal appears at the serial input 56a of a first serial-to-parallel conversion (shift register) means 56, which receives the third frequency $F_d$ clock signal at a clock input 56b and also receives the primary channel enabling ADDX O signal at an input 56c, from decoder means output 46c, to provide an M-bit parallel-formatted digital signal at shift register 1 means output 56d, to data bus 43. The serially-encoded digital reference signal appears at the serial input 58a of a second serial-to-parallel conversion (shift register) means 58, which receives the frequency $F_d$ clock signal at a clock input 58b and also receives the reference channel enabling signal ADDX1 at an input 58c, from decoder means output 46d, to provide another M-bit parallel-formatted digital signal from shift register 2 means output 58d, to data bus 43.

Since the ADDX 0 and ADDX 1 signals appear in mutually-exclusive manner, only one of outputs 56d and 58d provides data to bus 43 at any particular time. If ANC 30' is utilized with a communications transceiver, the digitally-encoded received data can be converted to analog form by use of DSP means 40, in conjunction with a parallel-to-serial conversion (shift register) means 58', which can be formed from the second serial-to-parallel conversion (shift register) means 58 if a programmable serial-to-parallel/parallel-to-serial shift register means, such as a standard 74HC595 integrated circuit and the like, is utilized therefor. Thus, the processed parallel digital signal received at a parallel input 58'b can be changed, responsive to the presence of a receive-mode $\overline{WE}$ signal at another control input 58'e, to provide a serially-encoded digital signal at serial output 58'a. This signal can be introduced into an incoming-signal input 52f of CODEC means 52, and then be reverse-converted from digital to analog format, such that the received signal appears in analog form at CODEC means 2 output 52g and at a terminal 30'f of the ANC apparatus. The analog signal can be further amplified by an audio frequency AF amplifier means 60 and provided to a transducer means 62, such as a loudspeaker and the like.

Figure 3:
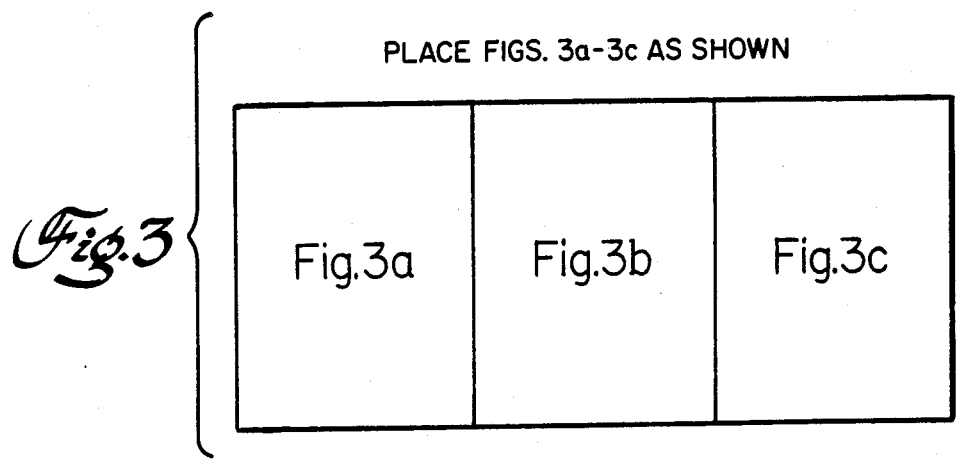
FIG. 3 illustrate the manner of joining the first, second and third diagram portions of FIGS. 3a-3c to provide a detailed schematic diagram of the circuitry for the presently preferred digital-signal-processing embodiment of our two-input crosstalk-resistant adaptive noise canceller.
Figure 4:
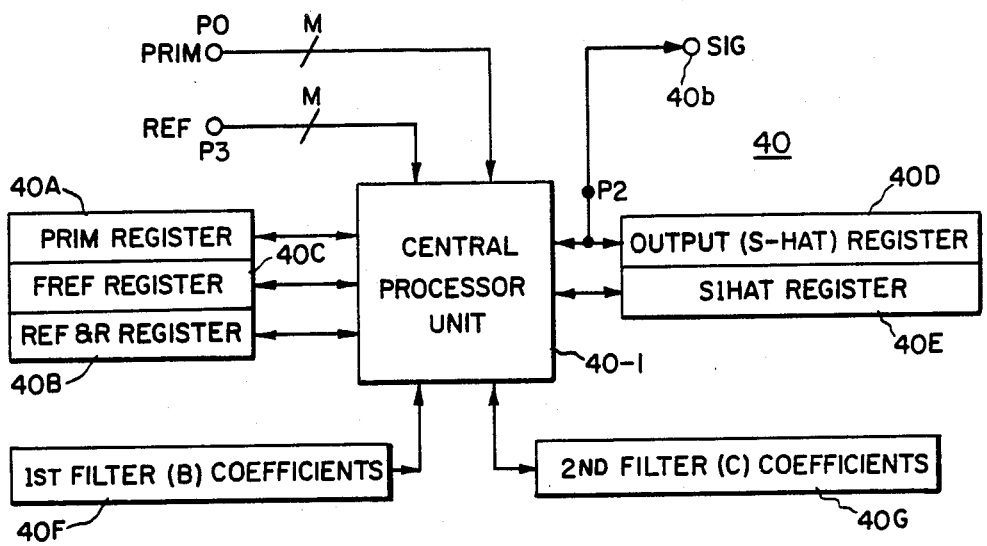
FIG. 4 is a block diagram illustrating the central processing unit (CPU) and the various working and constant register sets utilized in the digital-signal-processing microcontroller of the embodiment of FIGS. 2a and 3a-3c, and useful in understanding operation of the presently preferred embodiment.
Figure 3A:
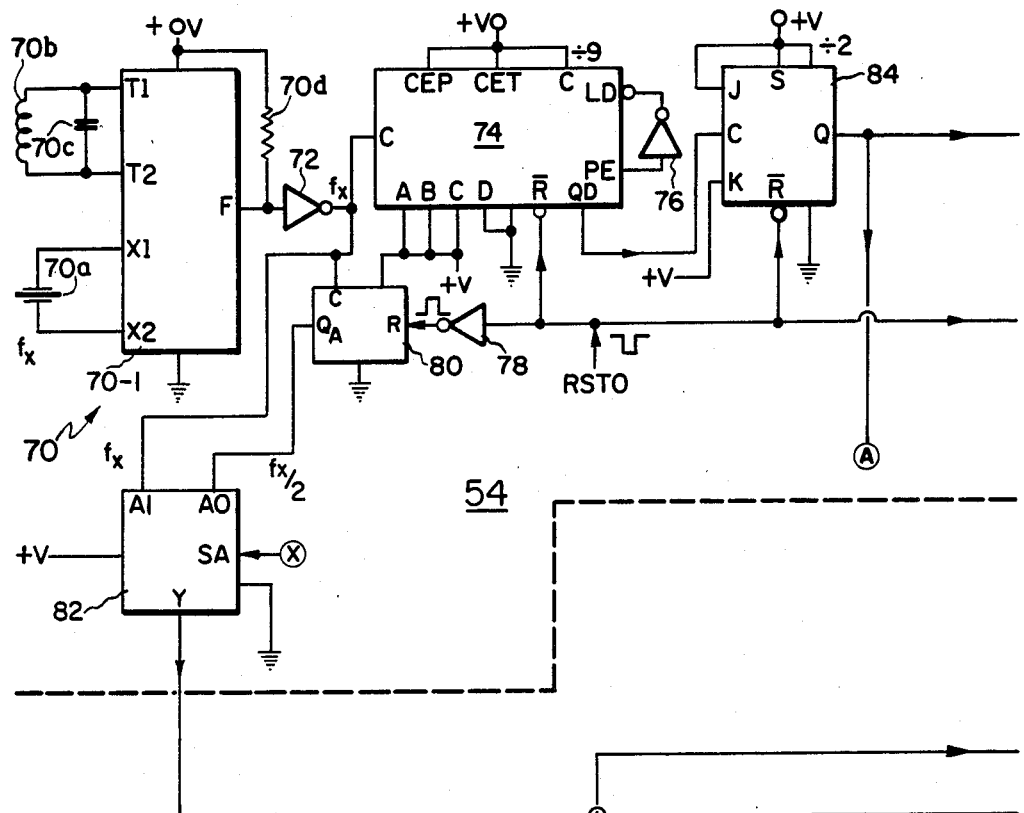
Figure 3A:
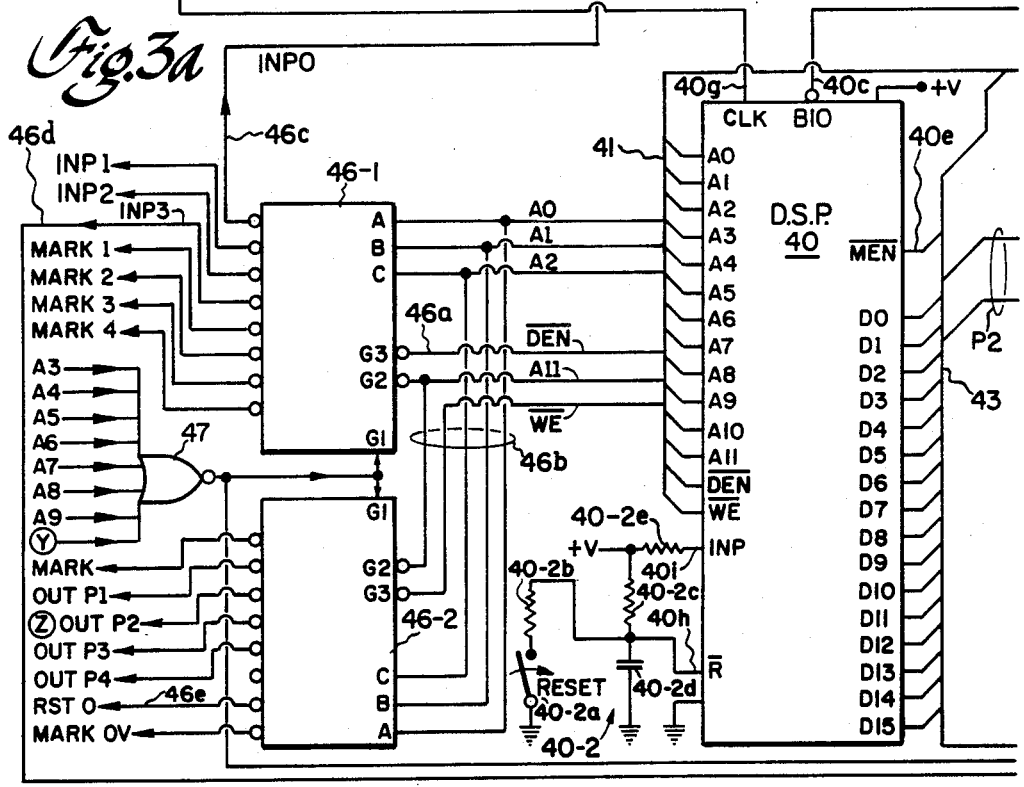
Figure 3C:
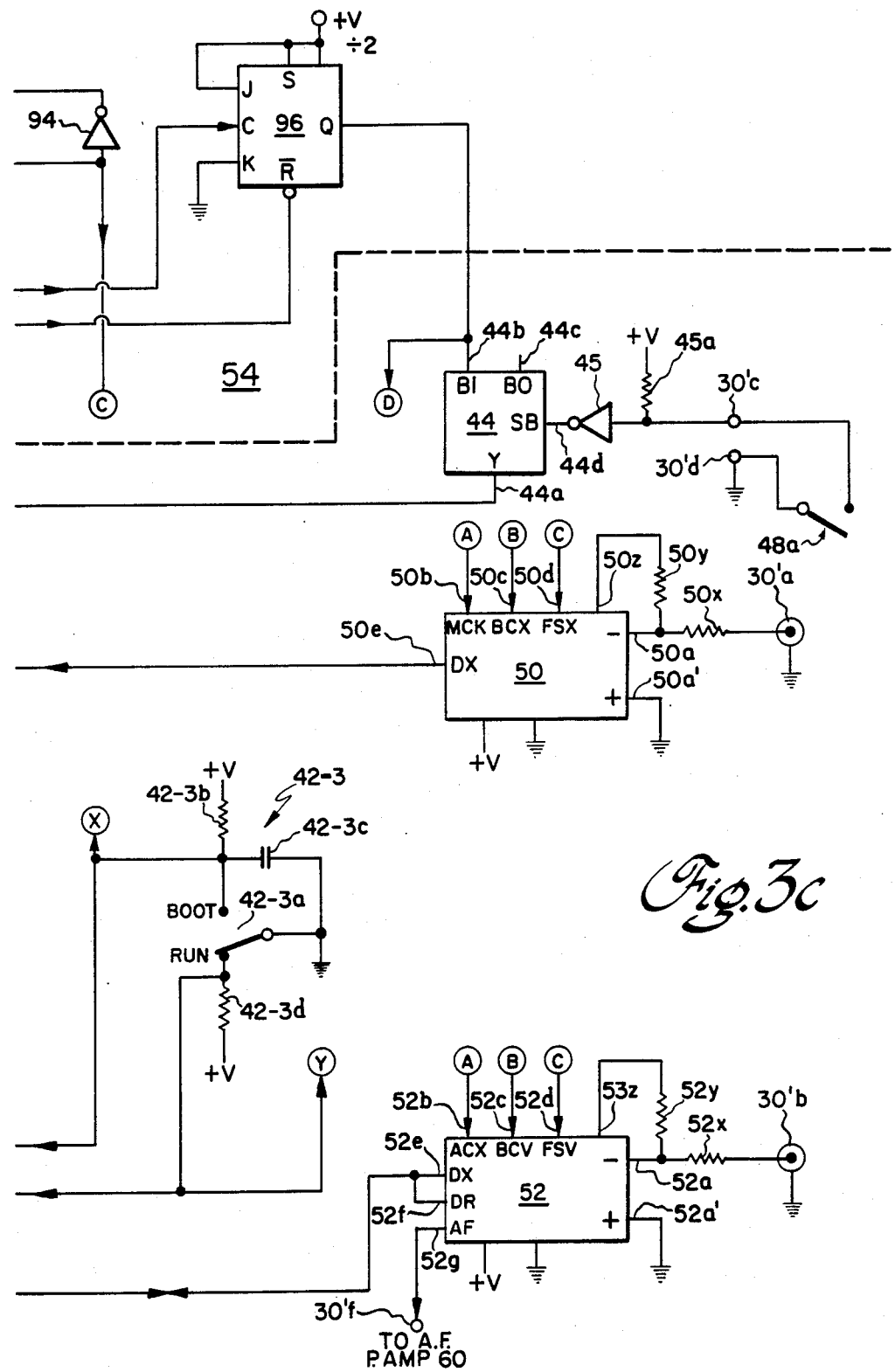

Referring now more specifically to FIGS. 3a-3c, arranged as shown in FIG. 3, and to FIG. 4, the DSP microcontroller means 40 "(FIG. 4)" must have a central processor unit 40-1 capable of processing the parallel M-bit digital signals provided at the primary signal input port P0 or the reference signal input port P3, with sufficient speed to provide the adaptive-noise-cancelled serial output signal (SIG) at terminal 40b. DSP means 40 also must have at least five working register sets denominated as: primary (PRIM) register set 40A; reference (R) register set 40B; W(n), or (FREF), register set 40C; output signal (S-HAT) register set 40D; and adaptive filter means 2 output (S1HAT) register set 40E; in addition to register sets 40F and 40G for respectively storing the first adaptive filter means (B) constants and the second adaptive filter means (C) constants. All of register sets 40A–40G work in conjunction with the CPU 40-1, under control of the program-control memory means 42, in manner to be described hereinbelow. Storage means 40A–40G are each referred to as a "register set", rather than as a single register, as a plurality of registers may be required for each, as, for example, to contain the N different terms for each of the first and second adaptive filter means and for each set of old and new primary, reference, $W_1$, $S_1$, and output data. In our presently preferred embodiment (FIG. 3, i.e. the joined set of FIGS. 3-a-3c), digital-signal-processing (DSP) means 40 (FIG. 3a) is a Texas Instruments TMS 32010 16/32-bit single-chip digital signal microprocessor. In this microprocessor, internal operations can be carried out with a 32-bit parallel bus, although the external data bus 43 is of M=16 parallel lines, while the address ADDX bus has L=12 parallel lines. The address and data busses 41 and 43, respectively, connect to the address port 42a, data port 42b and to output enable $\overline{OE}$ input 42c of read-only memory means 42, which is configured to store the illustrative object code program shown in the appendix attached hereto and discussed hereinbelow. Even though the illustrative program has less than 1000 words of object code, additional memory is made available for changes and enhancements, by configuring ROM means 42 (FIG. 3b) as a 4096×16-bit memory (using a pair of 4096×8-bit ROM integrated circuits). Because the read-only memory integrated circuits are insufficiently fast to operate with a DSP microprocessor at a clock CLK input 40g signal frequency of 20 MHz., we presently prefer to provide additional memory means 42' of the random-access type, into which volatile memory the non-volattily stored program from read-only memory means 42 is loaded at the beginning of operation of ANC 30'. Thus, random access memory means 42', also configured as a 4096×16-bit memory (utilizing four 2048×8-bit memory integrated circuits), also connects to the 12-bit address bus 41 and the 16-bit data bus 43. For the particular integrated circuits utilized for RAM 42', address bus line A11 is connected directly to a first enable input CE1, and is connected through an inverter 42-1 to a second chip enable CE2 input. RAM 42' has an output enable $\overline{OE}$ input connected to the output of a first two-input gate 42-2, having its first input receiving the $\overline{MEN}$ input from the DSP means output 40e and having another input receiving a "run" signal from boot/run selector circuit 42-3 (FIG. 3c). The output of another two-input gate 42-4 is connected to the write-enable $\overline{WE}$ gate, having the write-enable $\overline{WE}$ signal from DSP means 40 connected to a first input and the remaining input connected to the output of an 8-input NOR gate 47. Boot/run selector circuit means 42-3 utilizes a single-pole, double-throw switch means 42-3a, having: a common terminal thereof connected to circuit ground potential; a first selectable "boot" terminal thereof, connected through a pull-up resistance 42-3b to a source of positive operating potential +V and through a noise-filtering capacitance 42-3c to common potential, to provide a "boot" X signal to the ROM means 42 chip-enable $\overline{CE}$ input 42e; and a second selectable terminal thereof, connected through another pull-up resistance 42-3d to operating potential +V, to provide a "run" Y signal to the second input of gate 42-2. Thus, at operational start-up of ANC 30', switch means 42-3a provides a ground potential to ROM 42 chip enable $\overline{CE}$ input 42a and the non-volatile stored program is transferred, by a DSP means 40 boot program, from ROM 42 to RAM 42'. Thereafter, when switch means 42-3a connects the "run" Y terminal to ground potential, the ROM means chip enable $\overline{CE}$ input 42e is disabled and gate 42-2 is conditioned to enable the output of RAM 42' responsive to the $\overline{MEN}$ signal, so that the digital-signal-processing controller means 40 receives its instruction from the relatively-fast random-access memory means 42'.

Also associated with the particular DSP means 40 utilized (the TMS320), are a parallel-to-serial shift register means 40-1 (FIG. 3b) and a resetting means 40-2. Shift register 40-1 is necessary for conversion of an 8-bit parallel-format S(n) noise-cancelled output data byte (at output port P2) to an 8-bit serially-formatted data word for transmission, in all uses of the noise canceller where serial data transmission is, as illustrated, required. It should be understood that in applications where parallel data transmission can be utilized, parallel-to-serial conversion shift register means 40-1 is not required, and some form of gating the 8 parallel data lines D0-D7, responsive to an output select Z signal (hereinbelow further explained) would be utilized. With the serially-encoded output requirements for radio communications applications, means 40-1 is present and acts to convert the 8-bit parallel data word provided at data inputs D0-D7 to an 8-bit serial data word at output terminal 30'c, responsive to the serial-output data enabling signal Z appearing at the load LD input of register means 40-1, from a port 2 (OUT P2) output of decoder means 46.

Reset means 40-2 is typically provided for servicing use and serves to reset DSP means 40 as required. Means 40-2 includes a reset switch 40-2a serving, when closed, to connect the DSP means reset $\overline{R}$ input terminal 40h to ground potential through a resetting resistance 40-2b. When resetting switch 40-2a is open (to restart DSP means 40 operation), the reset $\overline{R}$ terminal 40h receives a positive operating potential +V through a pull-up resistor 40-2c, with a time constant determined by the resistance of pull-up resistor 40-2c and a shunt capacitance 40-2d. A pull-up resistor 40-2e is also provided between positive operating potential +V and the INP input 40i of the DSP means, for proper operation with the particular microcontroller illustrated.

Decoder means 46 utilizes a pair of one-of-8 decoders 46-1 and 46-2 and gate 47. Each of decoders 46-1 and 46-2 directly receives the address lines A0-A2 at the A-C inputs thereof and receives the A11 address lines at the G2 enabling inputs thereof. Gate 47 receives the address A3-A9 lines, as well as the "run" Y signal from means 42-3. Thus, the first enable G1 input of both decoders 46-1 and 46-2 receives an enabling logic 1 level only if all 8 inputs of gate 47, including the "run" Y signal, are at logic 0 levels. The appropriate one of the 8 outputs of a respective one of decoder 46-1 or 46-2 is therefore enabled responsive to the combination of the A, B and C inputs thereof, from address lines A0-A2, only if: the canceller is in the "run" mode; all of address bus lines A3-A9 and A11 are at the logic 0 level; and either the decoder enable $\overline{DEN}$ input 46a is at the low level, or the write-enable $\overline{WE}$ lines is in the logic low level, respectively. For operation of the two-input crosstalk-resistive adaptive noise canceller 30', only two outputs from decoder means 46-1 are relevant: the input port 0 (INP 0) enabling output 46c signal and the input port 3 (INP 3) enabling output 46d signal, while only the output port 2 (OUT P2) enabling signal Z and the reset 0 (RST 0) output 46e signal need be discussed with respect to second decoder means 46-2. As previously mentioned, the OUT P2 enable signal Z is utilized at the load LD input of parallel-to-serial shift register means 40-1 to convert the processed parallel output data to a noise-cancelled serial data output available at canceller apparatus output 30c. Before discussing the primary and reference input channel subportions and the use of the INP0 enable signal from output 46c and the INP3 enable signal from output 46d, the clock means 54, utilizing the RST 0 signal from output 46d, will be described.

Clock means 54 utilizes a crystal-controlled oscillator means 70, having an oscillator integrated circuit 70-1, such as the standard 74LS320. An oscillator frequency-$f_x$-determining crystal 70a is connected between first and second crystal terminals X1 and X2, and a parallel-resonant circuit, comprising an inductance 70b and a capacitance 70c, is connected between tank circuit terminals T1 and T2. A pull-up resistor 70d is connected between the positive operating potential +V source and the frequency $f_x$ signal output F terminal of the oscillator integrated circuit. An inverting buffer 72 is utilized to provide the crystal frequency $f_x$ signal at the output thereof, typically at a frequency of about 20 MHz. The oscillator-frequency $f_x$ signal is connected to the clock C input of a first frequency counter means 74 and to the clock C input of a divide-by-2 means 80, which provides a frequency ($f_x/2$) at its $Q_A$ output to a first selectable input A0 of a multiplexing means 82. The crystal-frequency $f_x$ signal is also provided to the second selectable input A1 of multiplexing means 82. Means 82, responsive to the logic 0 level "boot" X signal at a select input SA, connects first selectable input A0 to the Y output thereof, for providing the DSP means 40 clock CLK input 40g with a clock frequency waveform that is half the frequency of the waveform provided in the "run" mode. When the X signal level returns to a logic 1 level at input SA, the higher frequency $f_x$ input A1 is connected to the multiplexer output Y and the DSP means 40 clock input 40g. Thus, during the "boot" process, the digital-signal-processing microcontroller means 40 receives a lower clock-frequency signal, commensurate with the slower response of ROM means 42, to allow the ROM-stored program to be read therefrom and into RAM means 42'. In the "run" mode, the higher-speed RAM means 42' provides the control program command sequence and the DSP means 40 can run at the higher frequency $f_x$.

First counter means 74, second counter means 86 and third counter means 92 are respectively configured (with the companion inverters 76, 84 and 94, respectively, used for coupling the preset enable PE output to the load LD input of each counter, respectively) with the respective associated J-K flip-flop means 84, 90 and 96, into respective divide-by-18, divide-by-24 and divide-by-16 resettable counter means, respectively. Thus, counter means 74 is configured to a divide-by-9 configuration by connection of the presetting inputs A, B and C to a logic 1 level and the connection of presetting input D to a logic 0 level. Counter means 86 is established to function as a divide-by-12 means by connection of presetting inputs A, B and D to a logic 0 level and input C to a logic 1 level. Counter means 92 is preconditioned to act as a divide-by-8 means by connection of all of presetting inputs A-D thereof to a logic 0 level. Each of J-K flip-flops 84 and 90 acts as a divide-by-2 means, as does means 80. Flip-flop 96 acts as a divide-by-2 means which produces an output signal with a specified pulse duration. Each of the divider means 74, 84, 86, 90 and 92 is resettable to a zero output count responsive to a logic 0 level RST 0 pulse provided at the $\overline{R}$ input thereof; divider means 80 is resettable to a logic 0 output level responsive to a logic 1 pulse at the R input thereof, requiring the use of inverter 78 between the RST 0 input and the R input of divider means 80. Flip-flop 96 is reset by the third stage QC output of divider 86, so as to generate a pulse signal D having a desired duration. Thus, responsive to an RST 0 logic 0 pulse, all of the divider means outputs are reset, whereby, when the RST 0 line resumes a logic 1 level, a first frequency output A (at about 1.11 MHz.), a second frequency B output (at about 46.3 KHz.), and a third frequency C output (which is a pulse of about 22 microseconds duration at a frequency of about 5787 Hz.), are all provided, along with the fourth output D signal (a pulse of about 3.6 microseconds duration at the frequency of output C, and occurring at the end of the 22 microsecond pulse thereof). The $\overline{Q}$ output of flip-flop 90 also provides a B signal, at the same $\overline{B}$ signal frequency (about 46.3 KHz.).

Primary input connector 30'a (FIG. 3c) receives the primary signal from microphone 48 and processes the primary analog signal to a serially-encoded digital signal in first CODEC means 50. CODEC means 50 receives the three different respective frequency A, B and C signals at its MCK input 50b, BCX input 50c and FSX input 50d, respectively. The first CODEC means operates with a series input resistance 50x and a gain-setting resistance 50y, connected between input terminal 50a and auxiliary terminal 50z, and upon the signal between a first − input 50a and a second + input 50a', to provide the serially-encoded digital speech signal at output 50e. Associated with the primary signal transducer connected to input 30'a, is a switch means 48a which is pressed-to-talk (PTT) to connect PTT input terminal 30'c to common potential terminal 30'd, when speech (the desired signal) is to be received from transducer 48 and processed. When switch means 48a is open, a pull-up resistor 45a causes a logic 0 level to be provided at the output of inverter 45 and to the controlling SB input of another multiplexing means 44. In this non-talk/listen mode, multiplexer means 44 first input B0 is connected to the Y output 44a thereof and to the DSP means I/O input 40c, configuring the system to process incoming (received) digital speed information, as may be made available at input 44c. Only when switch means 48a is closed does a logic 1 signal appear at multiplexing means 44 input SB, connecting second selectable terminal B1 input 44b to the Y output 44a terminal, and providing the D signal to DSP means I/O input 40c, for causing the INP0 signal at decoder means output 46c to alternate with the INP3 signal at decoder means output 46d, to process the primary and reference channel inputs to DSP means 40.

The reference channel input 30'b receives the output of transducer 49 for processing in CODEC means 52, which receives the highest frequency A signal at an ACX input 52b, the frequency B signal at a BCV input 52c and the frequency C waveform at an FSV input 52d. The incoming reference channel signal is supplied, through a series resistance 52x, between the − input 52a and the + input 52a' of the CODEC; a gain-setting resistance 52y is connected between input 52a and auxiliary terminal 52z. The serially-encoded digital reference signal information appears at the transmitted signal output DX terminal 52e. For use with a received signal, a receive input DR terminal 52f is connected to terminal 52e, to share the serial input/output DS terminal of the subsequent shift register means 58. The recovered analog audio frequency AF signal at terminal 52g, in the receive mode, is provided to terminal 30'f, for connection to the audio frequency power amplifier means 60, previously discussed.

The respective serially-encoded digital signals from the primary and reverence channel CODEC means 50 or 52, respectively, are respectively applied to the serial data DS terminal of the respective one of conversion means 56 or 58 (FIG. 3b). Each of conversion means 56 or 58 has its reset $\overline{R}$ terminal tied to a logic 1 level (preventing conversion means reset). Each conversion means 56 or 58 receives the lowest frequency D waveform at a load LD input and receives the middle-frequency $\overline{B}$ signal at the serial clock SC input thereof. Each of conversion means 56 and 58 has a M-bit-wide parallel data port, comprising lines QA-QM, connected to the data bus 43; as illustrated, 8-bit-parallel data is utilized and the means 56 output port is port P0, while the means 58 output port is port P3. The strobe STB input of the primary channel conversion means 56 receives the logic 0 level input port 0 (INP0) pulse from decoder means output 46c, while the strobe (STB) input of the reference channel conversion means 58 receives the logic 0 level input port 3 (INP3) pulse from decoder means output 46d. Thus, the digital-signal-processing means 40, in conjunction with decoder means 46, sequentially issues an input port 0-load INP0 low-logic-level pulse, to load the parallel-encoded digital data for the primary channel into PRIM register set 40A and then issues an input port 3-load INP3 low-logic-level pulse, to load the parallel-encoded digital data for the reference channel for storage into the REF(R) register set 40B. By way of illustration only, CODECs 50 and 52 may be type 3053J integrated circuits, available from National Semiconductor Co., while conversion means 56 and 58 can each be a standard 74HC595, available from Motorola Inc. and other sources.

Figure 5:
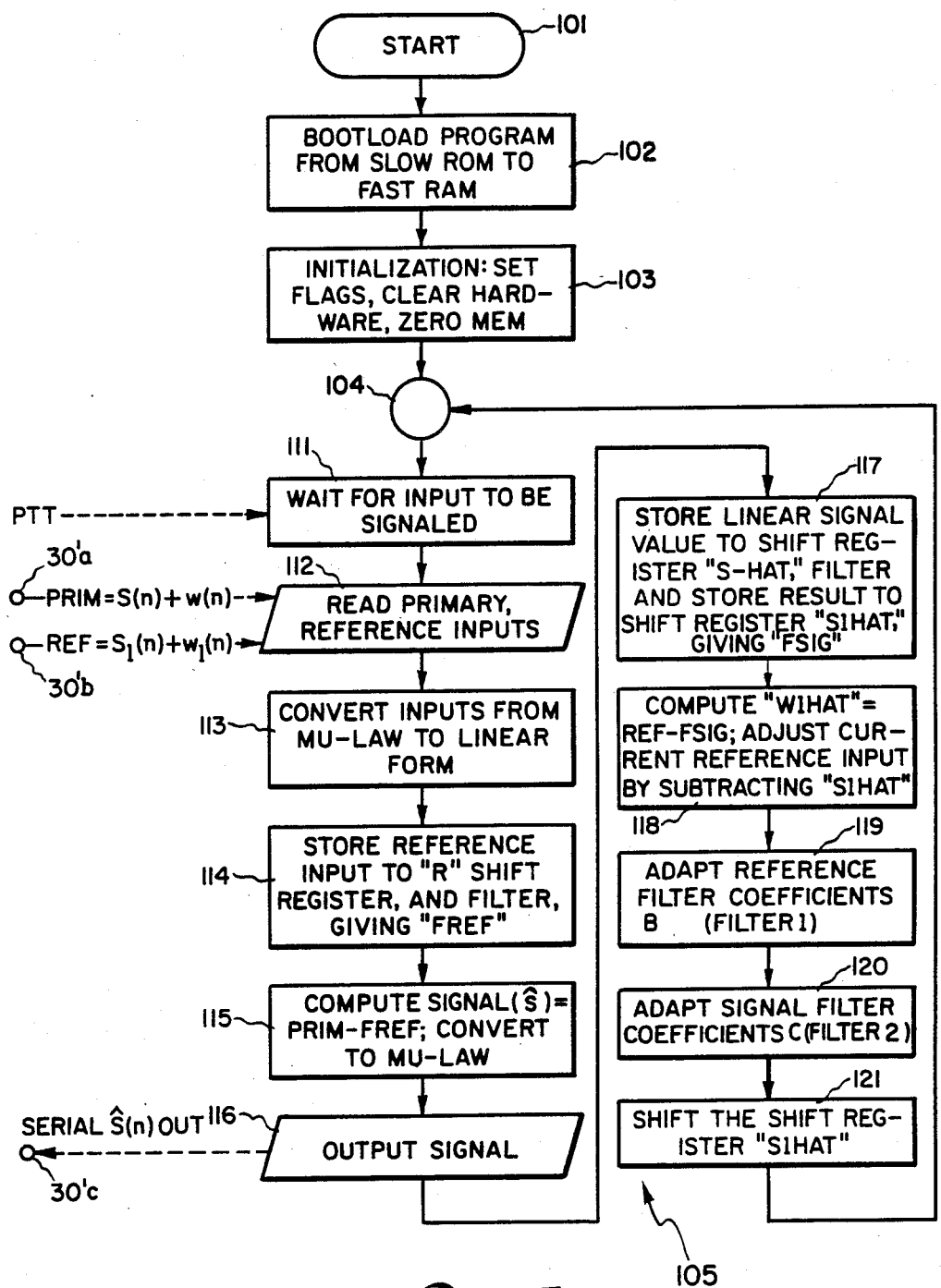
FIG. 5 is a flow chart illustrating the signal processing steps carried out in one program configuration utilized with the presently preferred adaptive noise canceller embodiment.

Referring now to FIGS. 4 and 5, our two-input crosstalk-resistant adaptive noise canceller, in the digital-signal-processing embodiment 30', operates on the register sets of FIG. 4 in accordance with the program flow chart of FIG. 5. The program is entered at START point 101, whereat the program for digital-signal-processing microcontroller means 40 is boot-loaded from the slower ROM means 42 to the faster RAM means 42', by operation of switch means 42-3. It should be understood that switch means 42-3 may be a manually-operated mechanical or electromechanical means, or an automatically-operated electrical or electronic means, such as a relay and the like, which is normally in the "boot" position (allowing "boot" operation upon initial power-up of the apparatus containing the automatic noise canceller) and which is automatically sequenced to the "run" position shortly after the equipment is powered-up. Upon entering the "run" condition, the program carries out an initialization subroutine, in step 103, in which procedures are carried out for setting flags, clearing hardware, zeroing memory and the like processes, as determined by the particular digital-signal-processing microcontroller, memory configuration and the like utilized for the automatic noise canceller. After the initialization step 103, the program enters node 104, which is the start/end node of the program main operating loop 105, in accordance with the object code listed in the Appendix.

Program main operating loop 105 commences with a first step 111 in which the automatic noise canceller waits for an input to be signalled; the input-present signal can be a combination of various predetermined parameters, including the closure of the PTT switch means 48a and the like conditions. Having determined in step 111 that a primary channel input should be available, the loop procedes to step 112, in which the primary and reference inputs are read from input terminals 30'a and 30'b, respectively. Reading of the primary input occurs by issuance of the input port 0 INP0 pulse from decoder means output 46c to the strobe STB input of primary channel conversion means 56, while the reference channel input is read by issuance of an input port 3 INP3 signal from decoder means output 46c to the strobe STB input of reference channel conversion means 58. Step 112 ends with the presence of the primary input channel signal parallelly-encoded digital data in the PRIM register set 40A (illustratively, only one register of the set is used), and with the presence of the reference input channel signal parallelly-encoded digital data in the REF and R register set 40B of digital-signal-processing microcontroller means 40. Step 113 is now entered and the primary and reference digital data encoded signals are converted to linear form from the generally non-linear form in which they were encoded by the respective CODEC means 50 and 52; for the illustrative type 3053J CODECs, the signals were μ-law encoded, whereby step 113 converts the two signals from μ-law to linear form and returns the linear-form primary signal to register 40A. The linear-form reference signal (returned to register set 40B in step 113) is, in step 114, stored in the R "shift" register set 40B and then filtered, in accordance with pre-stored first adaptive filter means B constants, to give an "FREF" signal which is stored in, e.g. illustratively in a single register of, register set 40C. The digital-signal-processing microcontroller means now retrieves the primary signal from register set 40A and the FREF filtered reference signal from register set 40C, and computes the output signal $\hat{S}$ as the difference between the PRIM signal and the FREF signal; this difference signal is then reconverted to a μ-law form. The program then enters step 116 and enables output port 2 OUT P2 signal Z, to parallel load bits of the $\hat{S}$ output signal into the parallel-to-serial register means 40-1, for clocking out to the canceller serial data output terminal 30'c. Thus, the serial data $\hat{S}(n)$ output signal is provided.

Having provided the first word of output signal, program loop 105 continues to step 117, wherein the output signal $\hat{S}(n)$ data is stored in the S-HAT register set 40D and is then filtered in accordance with the second adaptive filter means C constants, from register set 40G, to provide a result which gives the "FSIG" or S1HAT data for storage in the S1HAT register set 40E. In step 118, the reference signal data is taken from the REF register set 40B; the FSIG signal data, taken from the S1HAT register set 40E, is substracted therefrom, to compute the W1HAT signal data (equivalent to the output of second summer means 31 of FIG. 2). The S1HAT data is then used, in step 119, for adapting the first adaptive filter means B coefficients (equivalent to feedback $\hat{S}_1(n)$ to the first adaptive filter means second error-control input 32d of FIG. 2). In step 120, the second adaptive filter means C coefficients are adapted for operation on the signal output data in accordance with the new W1HAT values. In step 121, the S1HAT shift register set 40E is shifted in accordance with the new second filter means C coefficients to provide the new first adaptive filter means second error-control input 32d data parameters. Thereafter, with both the first and second adaptive filter means now having new coefficient B and C sets, respectively, stored in register sets 40F and 40G, respectively, the loop returns to node 104 and waits for further input to be signalled for processing. Upon step 111 again being entered and new input being signalled, loop 105 is again traversed, through node 104, and the wait-for-new-signal, process-new-signal and return path through the loop is continuously and cyclically traversed until new input is no longer signalled, e.g. as by release of the PTT switch means 48a.

FIG. 6 illustrates the test equipment 150 utilized to provide a set of primary and reference input test signals to a digital adaptive noise canceller of the type shown in FIG. 3. For simplicity, the desired signal is an audio-frequency sinusoidal signal, of about 250 Hz., provided at a level of about +55 dBmV. (i.e. about 1.2 V peak-peak) from a generator means 151. A noise generator 152 provides an output signal, at about 1.8 V p−p or about +59 dBmV., of uncorrelated samples of a Gaussian process, i.e. white Gaussian noise. A first, primary-input summer means 154 receives the +55 dBmV. audio-frequency signal at a first input 154a. The AF signal is attenuated, in a first attenuator 156, by $\alpha_s$ dB. (where $\alpha_s$ here is about 2 dB.), to provide a crosstalk signal to a second input 158b of a second reference-input summer means 158. The first input 158a of the second summer means receives the full output of the noise generator; a second attenuator 160 provides a selected attenuation $\alpha_n$ dB. (where $\alpha_n$ here is about 7 dB.) to provide the noise portion signal to primary input summer means second input 154b.

The first summer output 154c signal has a sinusoidal signal portion of about 1.2 V p−p (+55 dBmV.) and a noise portion of about 0.8 Vp−p (+54 dBmV.), for a signal-to-noise ratio of only +3 dB at the primary input, as shown in the upper-most trace (FIG. 6a) of the three-trace photograph. The second summer output 158c signal has a noise portion of about 1.8 Vp−p (+59 dBmV.) and a crosstalk portion of about 0.9 Vp−p (+53 dBmV.) for a crosstalk-signal/noise ratio of only −6 dB. at the reference input, as shown in the middle trace (FIG. 6c) on the photograph. The lowest trace (FIG. 6c) of the photograph shows an analog version of the adaptive noise canceller output signal; the serial digital data bit stream has been input to a digital-to-analog converter and the resulting analog output signal is shown. It will be seen that the noise content of the output signal is negligible, even with a crosstalk condition of greater than about −7 dB. (∼50%). The corresponding single-adaptive-filter noise canceller provides, for the same input conditions, an output signal which has an unusable signal-to-noise ratio.

While one presently preferred embodiment of our novel two-input crosstalk-resistant adaptive noise canceller has been illustrated herein, many variations and modifications will now become apparent to those skilled in the art. For example, use of hybrid analog/digital implementations of the basic processor shown in FIG. 2 and/or integration of portions, if not all, of the various elements of FIG. 3, and/or changes in the sequence in which the digital-signal microcontroller or microprocessor operates upon the primary and reference input information to derive the output information, are all contemplated for realization of our novel noise canceller. Accordingly, we intend to be limited only by the scope of the appending claims and not by way of the specific details and instrumentalities presented by way of description of a presently preferred embodiment herein.

| memory location | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0000 | F900 | 03C4 | 7F81 | 7F8D | 7F81 | 7F8B | 4E07 | F500 | 0009 | 6880 | 6800 | 7F89 | 707A | 5088 | F400 | 0000 |
| 0010 | 7E02 | 5009 | F900 | 0114 | E0A1 | E1A1 | E2A1 | E3A1 | E4A1 | E5A1 | E6A1 | F091 | E8A1 | E9A1 | EAA1 | E8A1 |
| 0020 | ECA1 | EDA1 | EEA1 | EFA1 | F061 | F0E1 | F161 | F1E1 | F261 | F2E1 | F361 | F3E1 | F461 | F4E1 | F561 | F5E1 |
| 0030 | F661 | F6E1 | F761 | F7E1 | F841 | F881 | F8C1 | F901 | F941 | F981 | F9C1 | FA01 | FA41 | FA81 | FAC1 | F801 |
| 0040 | F841 | F881 | FBC1 | FC01 | FC31 | FC51 | FC71 | FC91 | FC81 | FCD1 | FCF1 | FD11 | FD31 | FD51 | FD71 | FD91 |
| 0050 | FD81 | FDD1 | FDF1 | FE11 | FE29 | FE39 | FE49 | FE59 | FE69 | FE79 | FE89 | FE99 | FEA9 | FEB9 | FEC9 | FEC9 |
| 0060 | FEE9 | FEF9 | FF09 | FF19 | FF29 | FF2D | FF35 | FF30 | FF45 | FF4D | FF55 | FF5D | FF65 | FF60 | FF75 | FF7D |
| 0070 | FF85 | FF8D | FF95 | FF90 | FFAF | FFA7 | FFA8 | FFB3 | FFB7 | FFBB | FFBF | FFC3 | FFC7 | FFCB | FFCF |
| 0080 | FFC3 | FFD7 | FFD8 | FFDF | FFE2 | FFE4 | FFE6 | FFE8 | FFEA | FFEC | FFEE | FFFD | FFF2 | FFF4 | FFF6 | FFCF |
| 0090 | FFFA | FFFC | FFFE | 0000 | 1F5F | 1E5F | 1D5F | 1C5F | 1E5F | 1A5F | 195F | 185F | 175F | 165F | 155F | FFF8 |
| 00A0 | 135F | 125F | 113F | 105F | 0F9F | 0F9E | 0E9E | 0E1F | 0C9F | 0D1F | 0C9F | 0C1F | 089F | 081F | 0A9F | 145F |
| 00B0 | 099F | 091F | 089F | 081F | 0719 | 077F | 073F | 06FF | 068F | 067F | 063F | 05FF | 058F | 057F | 053F | 0A1F |
| 00C0 | 04BF | 047F | 043F | 03FF | 03CF | 03AF | 038F | 036F | 034F | 032F | 030F | 02EF | 02CF | 02AF | 028F | 04FF |
| 00D0 | 024F | 022F | 020F | 01EF | 01D7 | 01C7 | 01B7 | 01A7 | 0197 | 0187 | 0177 | 0167 | 0157 | 0147 | 0137 | 026F |
| 00E0 | 0117 | 0107 | 00F7 | 00E7 | 00DB | 00CB | 00CB | 00C3 | 00BB | 00B3 | 00AB | 00A3 | 009B | 0093 | 008B | 0127 |
| 00F0 | 007B | 0073 | 006B | 0063 | 005B | 0053 | 0055 | 0051 | 004D | 0049 | 0045 | 0041 | 003B | 0039 | 0035 | 0083 |
| 0100 | 0020 | 0029 | 0025 | 0021 | 001E | 001E | 001A | 0018 | 0016 | 0014 | 0012 | 0010 | 000E | 000C | 000A | 0031 |
| 0110 | 0006 | 0004 | 0002 | 0000 | 0114 | 0114 | 4107 | 7E02 | 7907 | FF00 | 0114 | 4000 | 4301 | 7EFF | 7900 | 000B |
| 0120 | 7EFF | 7901 | 5001 | 7E14 | F600 | 6700 | 7E14 | 6101 | 6701 | 2201 | 500A | 6880 | 7050 | 6B13 | 7F89 | 5000 |
| 0130 | 6B18 | 6098 | 6B17 | 6098 | 6100 | 6C98 | 6B15 | 6D98 | 6B14 | 6D98 | 6B13 | 6D98 | 6B12 | 6D98 | 6B11 | 6D9B |
| 0140 | 6B10 | 6D98 | 6B0F | 6D98 | 680E | 6D98 | 6B0D | 6D98 | 6B0C | 6D98 | 6B0B | 6D98 | 6B0A | 6D98 | 7F8F | 6D98 |
| 0150 | 2000 | 1002 | 5003 | 4607 | F800 | 031A | 5004 | 4B04 | 2203 | 5021 | 7073 | 6B30 | 7F83 | 6D98 | 682F | 5802 |
| 0160 | 6B2E | 6098 | 6B20 | 6D98 | 6B2C | 6D98 | 6B2B | 6D98 | 6B2A | 6D98 | 6B23 | 6D98 | 6B2B | 6C9B | 6827 | 6D98 |
| 0170 | 6B26 | 6D98 | 6B25 | 6D98 | 6B24 | 6D98 | 6B23 | 6D98 | 6B2B | 6B21 | 6B13 | 6D98 | 7F8F | 5805 | 2205 | 609B |
| 0180 | 2001 | 1005 | 5006 | 200B | 1038 | 500B | 6A03 | 6D0B | 7F8E | 5021 | F000 | F000 | 0191 | 0009 | FF00 | 5038 |
| 0190 | 1009 | 004B | 504E | 6D0C | 7F8E | 01A9 | 2107 | 0017 | 019D | 6D98 | 5050 | 0190E | 1009 | 004F | 504F | 0193 |
| 01A0 | 7F8E | 5B07 | 2107 | FD00 | 7F8E | 1009 | FF00 | 01AB | 6D0F | FD00 | FD00 | FD00 | 01C1 | 5807 | 2107 | 6D0D |
| 01B0 | 01B5 | 0009 | 0009 | 01B7 | 0009 | 5051 | 5051 | 5051 | 5051 | 5B07 | 2107 | 01CF | 1009 | 0009 | 6B11 | FD00 |
| 01C0 | 1009 | 0052 | 5052 | 6D10 | 7F8E | 2107 | 2107 | 01CB | 01CD | 0054 | FD00 | 6D12 | 7F8E | 0053 | 7F8F | 01C3 |
| 01D0 | 7F8E | 5B07 | 2107 | F000 | 01D9 | FF00 | FF00 | FD00 | 1009 | FF00 | 5054 | FD00 | 01DA | 5B07 | 5053 | 6D11 |
| 01E0 | 1009 | 0056 | 2107 | 01E7 | 1009 | 0055 | 5055 | 6D13 | 7F8E | 5B07 | 2107 | 6D12 | 01F1 | 0009 | 2107 | FD00 |
| 01F0 | 1009 | 0056 | FF00 | FD00 | 1009 | 005D | 5D07 | 01CB | 01CD | 0009 | FF00 | 01FF | 01F1 | 0009 | 5057 | 01F3 |
| 0200 | 7F8E | 7F8E | 5056 | 2107 | 7F85 | 7F8E | 7F8E | 020B | 1009 | 500B | 5050 | 6D16 | 7F8E | 5B07 | 2107 | 6D15 |
| 0210 | 0215 | 0009 | 504E | FD00 | 1009 | 026A | 5059 | 6D17 | 019D | 009B | 5B07 | 019F | 0221 | 004F | FF00 | FD00 |
| 0220 | 1009 | 005A | 505A | 0217 | 1009 | 026A | 5051 | FF00 | 022D | 1009 | 2107 | 60DE | 1009 | 0009 | 2107 | 0223 |
| 0230 | 7F8E | 5B07 | 2107 | FD00 | 7F8E | 029A | 2107 | 023B | 7F8E | 7F8E | FD00 | FD00 | 7F8E | 005B | 505B | 6D19 |
| 0240 | 0245 | 0009 | FF00 | 0247 | 1009 | 005D | 505D | 6A06 | 01CD | 005C | 505C | 01CF | 01C1 | 0053 | 5053 | 6D11 |
| 0250 | 0254 | 0009 | 0064 | 5064 | 6D23 | 7F8E | 5B07 | 2107 | 1009 | 7F8E | 5B07 | 2107 | 0252 | 5B07 | 2107 | FD00 |
| 0260 | 7F8E | 7F8E | 2107 | 2107 | 5067 | 026A | 0009 | 5067 | 026C | 1009 | C066 | 5066 | 0260 | 1003 | 0009 | 5065 |
| 0270 | 0276 | FD00 | FF00 | FD00 | 0278 | 1009 | 0067 | 5067 | 6D22 | 7F8E | 5B07 | 2107 | 6D25 | 7F8E | 5B07 | 2107 |
| 0280 | 0284 | 1009 | 5068 | 0217 | 6D27 | 029A | 5B07 | 5067 | 026C | 1009 | 5068 | 2107 | 0290 | 1009 | 0009 | 5069 |
| 0290 | FD00 | FD00 | FF00 | FD00 | 02A8 | 029A | 0063 | 5B07 | 029C | 7F8E | 006A | 506A | 6D29 | 7F8E | 505B | 2107 |
| 02A0 | 02B4 | 02A6 | 5065 | 2107 | 6D28 | 1009 | 2107 | 2107 | 022D | 1009 | 2107 | 2107 | FD00 | 1009 | 2107 | FF00 |
| 02B0 | FD00 | 1009 | 006C | 506C | FD00 | 005D | 5B07 | 5067 | 02CC | 7F8E | 006E | 506E | 02C0 | 1009 | 006D | 506D |
| 02C0 | 6D2C | 7F8E | 5B07 | 2107 | 6D28 | 02CA | 0009 | FF00 | FD00 | 02BE | 0009 | FF00 | 6D2D | 7F8E | 5B07 | 2107 |
| 02D0 | FD00 | 1009 | 006F | 5B07 | 6D2F | 1009 | 5B07 | FF00 | 02EE | 02BE | 5B07 | FF00 | FD00 | 02E2 | 0009 | FF00 |
| 02E0 | 02E4 | 02D6 | 5B07 | FD00 | 6D2F | 02FA | 0009 | FF00 | 02FC | 02EE | 5B07 | FF00 | 02C0 | 1009 | 006D | 5069 |
| 02F0 | FD00 | 1009 | 0009 | 5070 | 0B0B | 1009 | 0073 | 5073 | F900 | F900 | 0072 | 5072 | 02F0 | 7F8E | 5B07 | 2107 |
| 0300 | 693F | 0306 | 0009 | FF00 | 693A | 6939 | 6938 | 4707 | 6946 | 6945 | 6944 | 6943 | 6942 | 6941 | 6940 | FA00 |
| 0310 | 6D30 | 693D | 693C | 693B | 693B | 3002 | 7F88 | 6301 | F900 | 0114 | 6E01 | 7F8B | 7001 | 3000 | 5001 | 5071 |
| 0320 | 0324 | 3002 | F900 | 0330 | 7000 | 3002 |  | 6D30 | FF00 | 032D | 6101 | F900 | 032F | 6601 | 1000 | 5001 |

-continued

| memory location | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0330 | 6A00 | 81B3 | 7F8E | 1001 | FD00 | 034A | 87BF | 7F8E | 1001 | FD00 | 0371 | 8FFF | 7F8E | 1001 | FD00 | 03A6 |
| 0340 | 8FFF | 7F8E | 8F60 | 7F8F | 1001 | FD00 | 03B2 | 2702 | F900 | 03C2 | 8060 | 7F8E | 1001 | FB00 | 0360 | 8020 |
| 0350 | 7F8E | 1001 | FB00 | 0382 | 7007 | 3003 | 801E | 7F8E | 1001 | FD00 | 0B50 | 7F89 | 5000 | 2F00 | F900 | 03BE |
| 0360 | 8081 | 7FBE | 1001 | FB00 | 038E | 7005 | 3003 | 80DE | 7FBE | 1001 | FD00 | 0360 | 037E | 7F89 | 2D00 | F900 |
| 0370 | 03BE | 83B7 | 7F8E | 1001 | FB00 | 039A | 7003 | 3003 | 83DE | 7F89 | 1001 | 2E00 | F900 | 5000 | 5000 | 2B00 |
| 0380 | B900 | 03BE | 7006 | 3003 | 805E | 7F8E | 1001 | FD00 | 038A | 03BE | 5000 | 3003 | 037E | 7F89 | 7F89 | 3003 |
| 0390 | 81DE | 7F8E | 1001 | F000 | 0396 | 7F89 | 5000 | 2C00 | F900 | 7F8E | 7002 | FD00 | 87DE | 03BE | 7004 | FD00 |
| 03A0 | 03A2 | 7F89 | 5000 | 2A00 | F900 | 03BE | 7001 | 3003 | 8FDE | FD00 | 1001 | 7F89 | 03AE | 7F8E | 1001 | 2900 |
| 03B0 | F900 | 03BE | 7000 | 3003 | 8FFF | 7F8E | 8FDF | 7F8F | 1001 | FD00 | 03BC | FD00 | 5000 | 2800 | 5000 | 2000 |
| 03C0 | 04D3 | 0702 | 6B00 | 7F8D | 7E01 | 5007 | 2007 | 1007 | 6708 | 7D08 | FE00 | 03C7 | 7B04 | 5008 | 5800 | 7D08 |
| 03D0 | 7F80 | F900 | 03D0 | | | | | | | | | | | | 7E01 | |

What we claim is:

1. An adaptive noise canceller, comprising:

first means for receiving a primary signal having a first desired portion and a second undesired noise portion;

second means for receiving, during each of a successive sequence of time intervals (n); a reference signal (r(n)) having a first crosstalk portion with a time-amplitude characteristic similar to that of said primary signal first portion and a second noise portion with a time-amplitude characteristic similar to that of said primary signal second portion;

first summer means for subtracting from said primary signal, received from said first means, a noise reference signal ($\hat{w}(n)$) to provide an output signal ($\hat{S}(n)$) having said primary signal first portion and a second undesirable noise portion which is of reduced amplitude with respect to the amplitude of the primary signal second portion;

first adaptive filter means having a reference input receiving said reference signal (r(n)) from said second means, a first error-control input receiving said output signal ($\hat{S}(n)$), and a second error-control input receiving an estimation signal ($\hat{S}_1(n)$), for providing said noise reference signal ($\hat{w}(n)$) responsive to a predetermined response pattern dependent upon the conditions of all of said signals then present at said reference input, said first error-control input and said second error-control input;

second adaptive filter means having a reference input receiving said output signal ($\hat{S}(n)$) and a single error-control input receiving an auxiliary signal ($\hat{w}_1(n)$) for providing said estimation signal ($\hat{S}_1(n)$) to said first adaptive filter means second error-control input; and second summer means for subtracting said estimation signal ($\hat{S}_1(n)$) from said reference signal (r(n)) to provide said auxiliary signal ($\hat{W}_1(n)$) to said second adapter filter means signal error-control input.

2. The adaptive noise canceller of claim 1, wherein said first adaptive filter means provides said noise-reference signal ($\hat{w}(n)$) responsive to a set of filter coefficients ($b_k(n+1)$), where k is each integer number between zero and a number N of equivalent first filter taps, said filter coefficient set being periodically modified both by the output signal ($\hat{S}(n)$) at said first error-control input and by said estimation signal ($\hat{S}_1(n)$) at said second error-control input.

3. The adaptive noise canceller of claim 2, wherein the coefficients $b_k(n+1)$ of said first adaptive filter coefficient set are periodically modified in accordance with the formula:

$$b_k(n+1) = b_k(n) + 2\mu\hat{S}(n)[r(n-k) - \hat{S}_1(n-k)]$$

where $\mu$ is a first small positive step-size constant.

4. The adaptive noise canceller of claim 3, wherein said second adaptive filter means provides said auxiliary signal ($w_1(n)$) responsive to another set of filter coefficients $c_{k'}(n+1)$, where k' is each integer number between zero and a number N' of equivalent second filter taps, said another filter coefficient set being periodically modified by said auxiliary signal ($w_1(n)$) at said single error-control input.

5. The adaptive noise canceller of claim 4, wherein the number N of equivalent first filter taps is substantially equal to the number N' of equivalent second filter taps.

6. The adaptive noise canceller of claim 4, wherein the coefficients $c_k(n+1)$ of said second adaptive filter coefficient set are periodic modified in accordance with the formula:

$$c_{k'}(n+1) = c_{k'}(n) + 2\mu'[r(n) - \hat{S}_1(n)]\cdot\hat{S}(n-k')$$

where $\mu'$ is a second small step-size constant.

7. The adaptive noise canceller of claim 6, wherein said first constant $\mu$ is substantially equal to said second constant $\mu'$.

8. The adaptive noise canceller of claim 6, wherein said second adaptive filter means comprises a finite-impulse-response filter having a delay line of N' taps.

9. The adaptive noise canceller of claim 1, wherein said second adaptive filter means provides said auxiliary signal ($w_1(n)$) responsive to a set of filter coefficients $c_{k'}(n+1)$, where k' is all integer numbers between zero and a number N' of equivalent second filter taps, said filter coefficient set being periodically modified by said auxiliary signal ($w_1(n)$) at said single error-control input.

10. The adaptive noise canceller of claim 9, wherein the periodic modification of the set of second adaptive filter coefficients $c_{k'}(n+1)$ is in accordance with the formula:

$$c_{k'}(n+1) = c_{k'}(n) + 2\mu'[r(n) - S_1(n)]\cdot S(n-k')$$

where $\mu'$ is a small step-size constant.

11. The adaptive noise canceller of claim 10, wherein said second adaptive filter means comprises a finite-impulse-response filter having a delay line of N' taps.

12. An adaptive noise canceller, comprising:

microcontroller means for processing digital signals, said microcontroller means comprising at least a central processing unit and a plurality of register sets each containing at least one storage register of at least one storage location and at least two storage register sets for storing first and second adaptive filter coefficient sets $b_k$ and $c_k$ each having at least one coefficient term therein;

first means, receiving from a first transducer a primary input analog signal, containing a first desired signal portion and a second undesired random noise signal portion and having a first ratio of the amplitudes of the desired signal to the noise signal, for converting said primary analog signal to a digitally-encoded primary signal at a rate responsive to at least one clock signal;

second means, receiving from a second transducer, different from said first transducer, a reference input analog signal, having a first crosstalk signal portion with a time-amplitude characteristic similar to that of said first portion of said primary signal and having a second random noise portion with a time-amplitude characteristic similar to that of the second portion of said primary signal and having a crosstalk signal to noise signal amplitude ratio independent of the first ratio of the primary input analog signal, for converting said reference analog signal to a digitally-encoded reference signal at a rate responsive to said at least one clock signal;

clock means for providing said first and second converting means with said at least one clock signal;

memory means for storing a sequence of digital control signals to be sequentially provided to said microcontroller means responsive to requests therefrom, and for causing: (a) said microcontroller means to alternately obtain for storage in first and second register sets, respectively, the digitally-encoded primary and reference signals, respectively, from the respective first and second converting means; (b) to cause said microcontroller means to obtain, for storage in a third register set, at least one digital signal estimating the crosstalk speech portion in said reference signal; (c) for causing said microcontroller means to obtain, for storage in a fourth register set, at least one other signal estimating the noise portion of said reference signal; and (d) for causing said microcontroller means to then obtain, from the data in at least said first through fourth register sets and said first and second coefficient register sets, an output signal, for storage in a fifth register set, having the desired signal portion of said primary input and said second undesired portion of said primary input reduced in amplitude responsive to the reference signal noise portion estimation signal; and means receiving the reduced-noise-portion output signal from said fifth register set for providing a canceller output signal.

13. The adaptive noise canceller of claim 12, wherein said first means further comprises CODEC means for selectively filtering and then digitally-encoding, responsive to said at least one clock signal, said primary input analog signal.

14. The adaptive noise canceller of claim 13, wherein said CODEC means provides the digitally-encoded primary input signal as a serial data output signal having a series of sequential data bits.

15. The adaptive noise canceller of claim 14, wherein said microcontroller means has at least one parallel-data input port, said first means further including: means for converting the serial data output signal from said CODEC means to a parallel digital data format for introduction to said at least one data input port of said microcontroller means.

16. The adaptive noise canceller of claim 12, wherein said second means further comprises CODEC means for selectively filtering and then digitally-encoding, responsive to said at least one clock signal, said reference input analog signal.

17. The adaptive noise canceller of claim 16, wherein said CODEC means provides the digitally-encoded primary input signal as a serial data output signal having a series of sequential data bits.

18. The adaptive noise canceller of claim 17, wherein said microcontroller means has at least one parallel-data input port, said second means further including: means for converting the serial data output signal from the CODEC means to a parallel digital data format for introduction to said at least one data input port of said microcontroller means.

19. The adaptive noise canceller of claim 12, wherein said microcontroller means has at least one parallel-data output port and said output means further includes: means, receiving said output signal as a set of parallel data signals from said microcontroller output port, for converting said parallel digital data signals to a serial data bit stream which is provided as said canceller output signal.

20. The adaptive noise canceller of claim 12, wherein said memory means comprises: read-only memory (ROM) means having said digital control signals stored therein, but incapable of sequentially providing said digital control signals at a desired sequential rate responsive to requests therefor from said microcontroller means; random-access memory (RAM) means capable of providing said digital control signals at the desired sequential rate to said microcontroller means responsive to requests therefrom; and means for transferring the digital control signals stored in said ROM means to said RAM means upon commencement of operation of said adaptive noise canceller.

21. The adaptive noise canceller of claim 20, wherein said transferring means comprises: means for providing to said microcontroller means a first clock frequency, less than a desired microcontroller operating frequency at which the digital control signals are at said desired sequential rate, to cause said ROM means to be accessed at a first rate at the commencement of operation of said canceller and during transfer of the entirety of the digital control signals from said ROM means to said RAM means, and for then providing an operating clock frequency, greater than the first clock frequency, to said microcontroller means thereafter, to cause said digital control signals now stored in said RAM means to be provided to said microcontroller means responsive to requests therefrom, at a higher rate of transfer than possible from said ROM means.

22. The adaptive noise canceller of claim 21, wherein said clock means also provides said first clock frequency signal and said higher clock frequency signal.

23. The adaptive noise canceller of claim 12, wherein each of said at least two register sets for storing said first and second adaptive filter coefficient sets $b_k$ and $c_k$ store a predetermined number of coefficients sufficient to implement the equivalent of a finite-impulse-response filter having a preselected plurality of delay means taps.

24. The adaptive noise canceller of claim 23, wherein each of the first and second filter coefficient register sets stores a number of coefficients sufficient to implement a 16-tap delay-line filter.

25. The adaptive noise canceller of claim 12, wherein: the first coefficient set storage register stores the set of first coefficients $b_k(n)$, where k is each integer number between zero and a predetermined number N of equivalent first filter tops and n is one of a successive sequence of time intervals; and the microcontroller means is caused to periodically modify, during each time interval n, the set of first coefficients $b_k(n)$ to a set of first coefficients $b_k(n+1)$ in accordance with the formula $$b_k(n+1) = b_k(n) + 2\mu S(n)[r(n=k) - S1(n-k)]$$

where $\mu$ is a first small positive step-size constant, $S(n)$ is output signal data provided from the fifth register set, $r(n-k)$ is reference signal data provided from the second register set, and $S1(n-k)$ is crosstalk speech portion data provided from the third register set.

* * * * *